United States Patent
Oba et al.

(10) Patent No.: US 11,721,517 B2
(45) Date of Patent: Aug. 8, 2023

(54) FOCUSED ION BEAM PROCESSING APPARATUS

(71) Applicant: HITACHI HIGH-TECH SCIENCE CORPORATION, Tokyo (JP)

(72) Inventors: Hiroshi Oba, Tokyo (JP); Yasuhiko Sugiyama, Tokyo (JP); Yoshitomo Nakagawa, Tokyo (JP); Koji Nagahara, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 17/207,184

(22) Filed: Mar. 19, 2021

(65) Prior Publication Data

US 2021/0296080 A1   Sep. 23, 2021

(30) Foreign Application Priority Data

Mar. 23, 2020   (JP) .............................. JP2020-050997

(51) Int. Cl.
*H01J 37/12*   (2006.01)
*H01J 37/09*   (2006.01)
*H01J 37/317*   (2006.01)
*H01J 37/08*   (2006.01)
(Continued)

(52) U.S. Cl.
CPC ............... *H01J 37/12* (2013.01); *H01J 37/08* (2013.01); *H01J 37/09* (2013.01); *H01J 37/20* (2013.01); *H01J 37/21* (2013.01); *H01J 37/3175* (2013.01); *H01J 2237/31788* (2013.01)

(58) Field of Classification Search
CPC .. H01J 37/08; H01J 37/09; H01J 37/12; H01J 37/20; H01J 37/21; H01J 37/3007; H01J 37/3175; H01J 2237/045; H01J 2237/30477; H01J 2237/31745; H01J 2237/31788
See application file for complete search history.

(56) References Cited

U.S. PATENT DOCUMENTS 6,635,402 B2 *  10/2003  Yahiro  ................ H01J 37/3174
                                                          250/397
7,351,983 B2 *  4/2008  Sakaguchi  ............. H01J 37/12
                                                          250/398
(Continued)

FOREIGN PATENT DOCUMENTS

JP   H09162098 A   6/1997
JP   5048919 B2   10/2012
JP   5247761 B2   7/2013

*Primary Examiner* — Wyatt A Stoffa
(74) *Attorney, Agent, or Firm* — Holland & Hart LLP

(57) ABSTRACT

Provided is a focused ion beam processing apparatus including: an ion source; a sample stage a condenser lens; an aperture having a slit in a straight line shape; a projection lens and the sample stage, wherein, in a transfer mode, by Köhler illumination, with an applied voltage of the condenser lens when a focused ion beam is focused on a main surface of the projection lens scaled to be 100, the applied voltage is set to be less than 100 and greater than or equal to 80; a position of the aperture is set such that the focused ion beam is masked by the aperture with the one side of the aperture at a distance greater than 0 μm and equal to or less than 500 μm from a center of the focused ion beam; and the shape of the slit is transferred onto the sample.

8 Claims, 11 Drawing Sheets

(51) Int. Cl.
*H01J 37/20* (2006.01)
*H01J 37/21* (2006.01)

(56) References Cited

U.S. PATENT DOCUMENTS

| | | | | |
|---|---|---|---|---|
| 7,601,969 | B2* | 10/2009 | Doering | B82Y 40/00 |
| | | | | 250/396 ML |
| 9,934,936 | B2* | 4/2018 | Potocek | H01J 37/263 |
| 2003/0085365 | A1* | 5/2003 | Yahiro | H01J 37/28 |
| | | | | 250/492.2 |
| 2004/0149925 | A1* | 8/2004 | Muller | B82Y 10/00 |
| | | | | 250/396 R |
| 2013/0284593 | A1* | 10/2013 | Shichi | C23C 14/3442 |
| | | | | 204/298.03 |
| 2015/0146179 | A1* | 5/2015 | Utsumi | H01J 37/3174 |
| | | | | 355/53 |
| 2022/0139665 | A1* | 5/2022 | Schubert | H01J 37/3023 |
| | | | | 250/307 |

* cited by examiner

FOCUSED ION BEAM PROCESSING APPARATUS

CROSS REFERENCE TO RELATED APPLICATION(S)

This application claims the benefit of Japanese Patent Application No. 2020-050997, filed Mar. 23 2020, which is hereby incorporated by reference in its entirety into this application.

BACKGROUND OF THE INVENTION

1. Technical Field

The present disclosure relates to a focused ion beam processing apparatus performing cross-section processing of a sample.

2. Description of the Related Art

Conventionally, a focused ion beam processing apparatus is used to perform cross-section processing of a sample and the cross-section is observed.

Cross-section processing is performed as shown in FIG. 12. First, being perpendicular to a surface $200a$ of a sample 200, a focused ion beam 20A is emitted. Then, by scanning an irradiation position of a focused ion beam 20A, a cross-section $200c$ (parallel to the irradiation direction of the focused ion beam 20A) perpendicular to the surface $200a$ of the sample 200 is etched.

However, there is an angle between a focused ion beam 20A and an electron beam 10A of an SEM column for observing the cross-section $200c$ after cross-section processing, so a region away from the cross-section $200c$ does not need to be etched as deeply as a region near the cross-section. Therefore, in order to reduce the time taken for etching and improve operation efficiency, processing is performed in a shape of a slope (tilt) surface that rises from the bottom of the cross-section $200c$ towards the surface $200a$ at a predetermined angle θ (for example, a 54 degree angle). In the related art, considering the practical processing time, the size of the cross-section is several tens of μm or at most 100 μm or less.

However, recently, in a sample such as a semiconductor device, a mineral, etc., there has been a need for cross-section processing of 100 μm or more. In terms of reducing the time taken for etching, it is necessary to emit a focused ion beam with as high current as possible.

Therefore, as a focused ion beam, instead of a metal ion beam of Ga, Xe ions are extracted from plasma and used for the focused ion beam, so that the sample is irradiated with a beam having higher current than the Ga ion beam.

In a focusing mode, the sample is irradiated with such a focused ion beam having high current and is processed. Specifically, in the focusing mode, beams do not cross and have almost parallel trajectories between a condenser lens and an objective lens, and expansion of an angle of the beam is adjusted by a round aperture provided between the condenser lens and the objective lens, so that the optimum beam profile is acquired. By performing scanning by a beam deflector with the beam acquired in this way, a cross-section at a desired position is produced.

However, in the focusing mode, a beam diameter is large for high current, so there is a problem that a rounded edge occurs near a top surface of a sample in a cross-section or that processing lines or steps remain in a sample containing materials with different sputtering yields, such as the device, etc. In addition, if finish processing is performed with a low current beam to reduce the rounded edge or the processing line, the total time required for processing is long, resulting in a decrease in operation efficiency. In particular, when the depth (length) of the cross-section requiring a high current beam is large, it takes a longer time for finish processing with a low current beam.

In the meantime, an aperture having a rectangular slit other than a round hole is placed in a beam path between a condenser lens and an objective lens of an FIB column, and a part of a focused ion beam is masked using the slit, so that the slit-shaped beam is emitted, which is called a transfer mode. Herein, in the transfer mode, the objective lens is called a projection lens.

In the transfer mode, since the focused ion beam masked by the aperture is used, the cross-section after processing is more sharpened than that of the focusing mode.

As a technique using the transfer mode, a technique for cross-section processing a sample with a slit-shaped beam shaped by an aperture has been developed (Patent Document 1).

In the technique of Patent Document 1, as shown in FIG. 13, a cross-section sample having a slope $200s$ is produced. That is, by using an aperture 500 having a slit $500s$ in a narrow long shape, irradiation with a focused ion beam 20A passing through the slit $500s$ is performed on a position farthest from a cross-section $200c$, so that a shallow hole of depth D1 is subjected to etching processing. Next, the irradiation region of the ion beam is sequentially shifted towards the cross-section $200c$, and the time taken for etching is made longer to perform deeper etching processing. In this way, gradually deeper hole processing is performed, and in the end, etching processing for forming the cross-section $200c$ of the deepest depth D2 is performed, thereby acquiring a final cross-section shown in FIG. 13.

In addition, in the transfer mode, the beam reaching the sample surface has the smallest distortion on the optic axis, and the image resolution deteriorates as it moves away from the optic axis.

Therefore, a technique in which one side of a mask for forming a cross-section of a sample is aligned with an optic axis of an ion beam has been developed (Patent Document 2).

Accordingly, a cross-section of a sample is processed to be sharp.

In addition, unlike the transfer mode, a technique in which a projection lens is not used, but a beam spot shaped by an opening of a mask is used for cross-section processing of a sample has been developed (Patent Document 3).

DOCUMENTS OF RELATED ART (Patent Document 1) Japanese Patent Application Publication No. 5247761 (FIG. 1, FIG. 9, and paragraph 0025)
(Patent Document 2) Japanese Patent Application Publication No. 3531323
(Patent Document 3) Japanese Patent Application Publication No. 5048919

SUMMARY OF THE INVENTION

However, when the transfer mode is used, a part of an ion beam is masked by the aperture 500 and is not used for etching. Therefore, generally, operation efficiency is low.

In addition, in the case of Patent Document 1, as shown in FIG. 13, it is necessary to perform multiple etching operations by using a long shaped ion beam masked by the aperture 500 and varying the time taken for etching each time. This decreases operation efficiency.

In addition, in the case of Patent Document 2, the current distribution of the shaped beam acquired by being masked in the transfer mode is uniform (hatching R1 in FIG. 6), and etching is performed in a rectangular shape with a uniform depth from the sample surface. In the meantime, as shown in FIG. 12, the required cross-section is a shape of the slope 200s connected to the cross-section 200c, but etching is performed unnecessarily deeper than the slope 200s. Thus, operation efficiency decreases.

In addition, sputter products of the unnecessarily etched part adhere to the cross-section, and thus the amount of finish processing for acquiring a sharp cross-section increases, which decreases operation efficiency.

In addition, in the case of the technique disclosed in Patent Document 3, a projection lens projecting the shape of the opening of the mask toward the sample is not used between the mask and the sample, so that the beam profile is as small as several μm at most, and it is impossible to generate a shaped beam in a size capable of performing cross-section processing at once.

The present disclosure is directed to providing a focused ion beam processing apparatus capable of improving a shape of a cross-section when cross-section processing is performed using a focused ion beam, and improving operation efficiency.

According to the present disclosure, there is provided a focused ion beam processing apparatus for processing a cross-section parallel to an irradiation direction of a focused ion beam with respect to a sample including: an ion source; a sample stage holding a sample; a condenser lens focusing ions emitted from the ion source into a focused ion beam; an aperture having a slit with at least one side in a straight line shape, the slit being used to mask a part of the focused ion beam focused by the condenser lens to process the sample into a desired shape; and a projection lens placed in a beam path between the aperture and the sample stage, and focusing the focused ion beam that passed through the aperture on a predetermined position on the sample with the aperture as a light source, wherein, in a transfer mode, by Köhler illumination, with an applied voltage of the condenser lens scaled to be 100 when the focused ion beam is focused on a main surface of the projection lens, the applied voltage of the condenser lens is set to be less than 100 and greater than or equal to 80; a position of the aperture is set such that the focused ion beam is masked by the aperture with the one side of the aperture at a distance greater than 0 μm and equal to or less than 500 μm from a center of the focused ion beam; an applied voltage of the projection lens is set to be an applied voltage at which an image formed by the slit of the aperture is focused on a surface of the sample; and without scanning with the focused ion beam, the surface of the sample is irradiated at once with the focused ion beam formed in the shape of the slit, so that the shape of the slit is transferred onto the sample.

According to the focused ion beam processing apparatus, the absolute value of the voltage applied to the condenser lens is reduced, so that the probe current is concentrated near the center of the sample. Therefore, the sample is etched with the probe current having a current density distribution where the peak is at the center of the focused ion beam and a gradual decrease is shown as it goes away from the center, so that the center with high current density is etched most deeply.

In the meantime, a required sample cross-section is in an approximate V shape having a cross-section etched vertically from the sample surface and a slope connected to the cross-section. Therefore, when the sample is etched with the probe current having the above-described current density distribution, the sample is etched into a contour close to the approximate V shape defined by the cross-section and the slope connected to the cross-section, whereby the ion beam is used for etching without waste in cross-section processing. In addition, when the peak of the probe current is matched to the cross-section where deepest etching is required, the cross-section is deeply etched without additional etching. Consequently, operation efficiency is improved.

In addition, sputter products generated due to etching adhere to the cross-section that is an observation target, and etching of an unnecessary region is reduced, so that adhesion of sputter products to the cross-section is reduced and operation efficiency is improved.

In addition, by using the aperture having the slit of which at least one side is in a straight line shape, the one side is placed to be slightly shifted from the center of the focused ion beam.

In this way, in the above-described probe current distribution, an approximate half from the center is masked and only the opposite approximate half from the center operates as probe current.

As a result, the probe current distribution is in a shape close to the contour of the approximately V-shaped cross-section as described above, so that the ion beam is used for etching without waste.

In addition, since the probe current passing through the aperture performs etching into a shape close to the contour of the approximately V-shaped cross-section, the shape of the cross-section of the sample is formed at once using the aperture without scanning with the focused ion beam, whereby operation efficiency is further improved.

In addition, since the ion beam is masked by one side, which is in a straight line shape, of the slit of the aperture so as to etch the cross-section, a rounded edge (step) rarely occurs at the cross-section, thereby improving the shape of the cross-section.

In the focused ion beam processing apparatus of the present disclosure, a beam size of the focused ion beam may be adjusted by adjusting the applied voltage of the projection lens.

In the transfer mode, the shape of the focused ion beam reflects the shape of the slit, and the projection magnification for transferring the shape of the slit is uniquely determined by the geometry of the aperture, the projection lens, and the sample. Therefore, the shape of the aperture needs to be changed to change the length of the cross-section through cross-section processing of the sample. However, for example, if a cross-section (e.g., 10%) larger than the current slit is intended to be created, another aperture having a larger slit needs to be used or an additional slit needs to be formed in one aperture, which causes problems with operation efficiency or a device space.

Therefore, when the applied voltage of the projection lens is changed, the projection magnification is thus changed, thereby easily changing the length of the cross-section.

In addition, the beam is distorted when the applied voltage of the projection lens is changed, so it is difficult to accurately transfer the shape of the slit. However, in forming a cross-section, there is no problem as long as the edge of the beam is straight.

In addition, the length of the cross-section refers to a length of an intersection line (ridge) between the surface and the cross-section of the sample.

In the focused ion beam processing apparatus of the present disclosure, the slit of the aperture may be in a rectangular shape.

According to the focused ion beam processing apparatus, an appropriate cross-section may be acquired by performing rectangular-shaped etching on the sample.

In the focused ion beam processing apparatus of the present disclosure, the ion source may be a plasma ion source.

According to the focused ion beam processing apparatus, a high current ion beam is acquired compared to a Ga ion source, and the like, so that operation efficiency is improved.

According to the present disclosure, provided is a focused ion beam processing apparatus capable of improving a shape of a cross-section when cross-section processing is performed using a focused ion beam, and improving operation efficiency.

BRIEF DESCRIPTION OF THE DRAWINGS

The above and other objectives, features, and advantages of the present disclosure will be more clearly understood from the following detailed description taken in conjunction with the accompanying drawings, in which.

DESCRIPTION OF THE PREFERRED EMBODIMENTS

Hereinafter, an embodiment of the present disclosure will be described with reference to the accompanying drawings.

Figure 1:
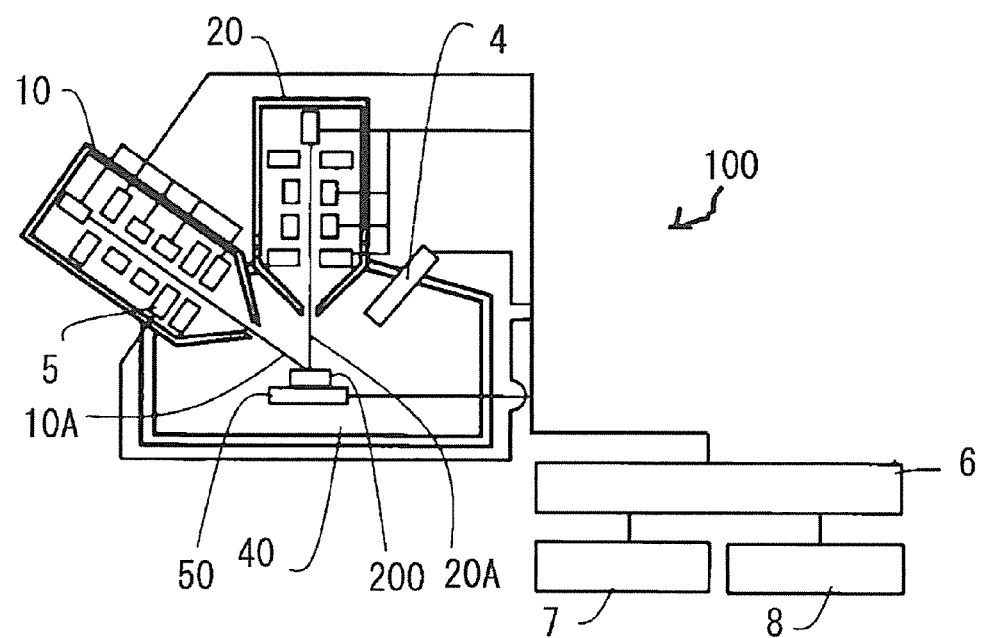
FIG. 1 is a diagram showing an overall configuration of a focused ion beam processing apparatus according to an embodiment of the present disclosure.

FIG. 1 is a diagram showing an overall configuration of a focused ion beam processing apparatus 100 according to an embodiment of the present disclosure. In FIG. 1, the focused ion beam processing apparatus 100 includes an electron beam column (SEM column) 10, a focused ion beam column (FIB column) 20, secondary electron detectors 4 and 5, a control means 6, a display unit 7, an input means 8, and a sample stage 50. A sample 200 placed on the sample stage 50 is processed by a focused ion beam and observation is performed using an SEM.

In addition, in FIG. 1, the FIB column 20 is placed to be vertical, and the SEM column 10 is placed at a predetermined angle from the vertical, but no limitation thereto is imposed.

A part or all of the elements of the focused ion beam processing apparatus 100 are provided inside a vacuum chamber 40, and the internal pressure of the vacuum chamber 40 is reduced to a predetermined degree of a vacuum.

As described above, the sample 200 is placed on the sample stage 50. In addition, the sample stage 50 includes a moving unit capable of displacing the sample 200 along five axes.

The control means 6 may be a computer including: a CPU as a central processing unit; a storage (RAM and ROM) storing data, program, or the like; and an input port and an output port performing input and output of signals between external devices. In the control means 6, the CPU executes various types of processing on the basis of the program stored on the storage and controls the elements of the focused ion beam processing apparatus 100. In addition, the control means 6 is electrically connected to control wiring, etc. of the electron beam column 10, the focused ion beam column 20, the secondary electron detectors 4 and 5, and the sample stage 50.

In addition, the control means 6 drives the sample stage 50 on the basis of software instructions or operator inputs, and adjusts the location or position of the sample 200 to adjust an irradiation position or an irradiation angle of an electron beam 10A, an ion beam 20A with respect to the surface of the sample 200.

In addition, the input means 8 and the display unit 7 are connected to the control means 6. The input means 8 is a keyboard, or the like for receiving operator's input instructions. The display unit 7 displays an image of the sample, and the like.

Although not shown, the SEM column 10 includes an electron source emitting electrons, and electron optics shaping the electrons emitted from the electron source into a beam profile and performing scanning. The sample 200 is irradiated with the electron beam 10A emitted from the electron beam column 10, so that secondary electrons are generated from the sample 200. The generated secondary electrons are detected by the secondary electron detector 5 inside the column or by the secondary electron detector 4 outside the column, so that an image of the sample 200 may be acquired. In addition, back-scattered electrons may be detected by a back-scattered electron detector inside the column, so that an image of the sample 200 is acquired.

For example, the electron optics includes: a condenser lens focusing the electron beam 10A; an iris narrowing the electron beam 10A; an aligner adjusting the optical axis of the electron beam 10A; an objective lens focusing the electron beam 10A on the sample 200; and a deflector for scanning the sample 200 with the electron beam 10A.

The FIB column 20 includes an ion source generating ions, and ion optics shaping the ions emitted from the ion source into a focused ion beam and performing scanning, as described later. The sample 200 is irradiated with the focused ion beam 20A, which is a charged particle beam, from the FIB column 20 so that etching processing is performed, thereby processing a cross-section 200c of the sample 200 (see FIG. 12).

Figure 2:
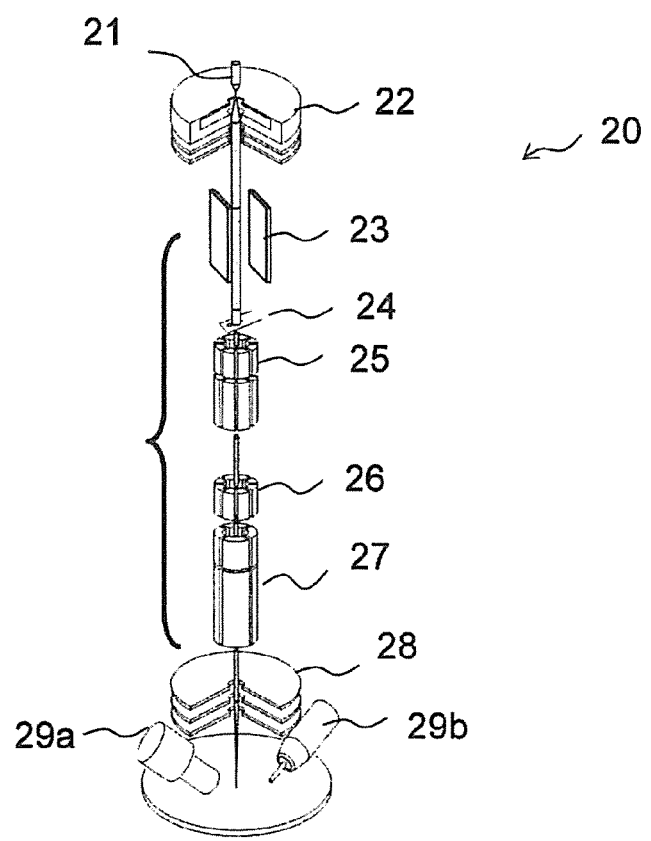
FIG. 2 is a diagram showing a configuration of an FIB column.

As shown in FIG. 2, starting from the ion source 21 to the objective lens 28, the FIB column 20 includes, in the following order: the ion source 21 generating ions; a condenser lens 22 focusing the ions emitted from the ion source into a focused ion beam 20A; a blanker 23 turning on/off the ion beam; an aperture (movable iris) 24; an aligner 25; a stigmator 26; a scanning electrode 27; and an objective lens 28 focusing the focused ion beam 20A on a predetermined position at the sample 200. In addition, near the objective lens 28, a secondary electron detector 29a and a gas gun 29b are placed.

The aligner 25 adjusting the trajectory of the ion beam so that the ion beam passes through the central axis of the objective lens 28. The stigmator 26 has a function of correcting astigmatism, and the scanning electrode 27 has a function of scanning the sample with the beam.

The blanker 23 and the scanning electrode 27 constitute a deflector.

Figure 7:
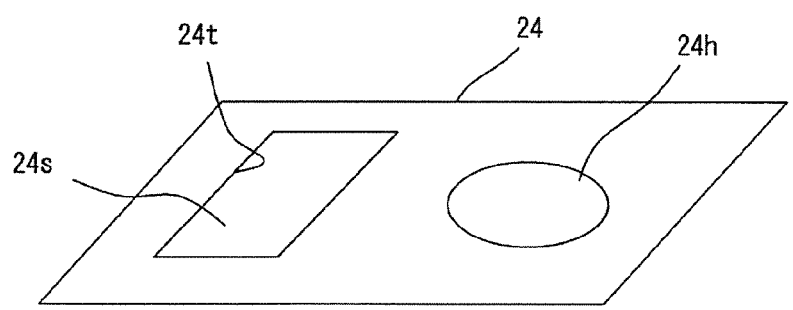
FIG. 7 is a diagram showing an aperture that has a slit of which one side is in a straight line shape.

As shown in FIG. 7, the aperture 24 has a slit 24s of which at least one side 24t is in a straight line shape. The slit 24s is used to mask a part of the focused ion beam 20A focused by the condenser lens 22 and process the sample 200 into a desired shape. The present disclosure employs the transfer mode in which a part of an ion beam is masked by the slit 24s and the slit-shaped beam is emitted.

In addition, as shown in FIG. 7, the aperture 24 also has a round hole 24h for the focusing mode so that observation and processing of the sample are performed even through scanning with the ion beam in the focusing mode. The round hole 24h is for adjusting expansion of an angle of the ion beam. The aperture 24 is moved within an aperture plane by a driving unit (not shown) so that the slit 24s or the round hole 24h is selected, thereby switching mode between the transfer mode and the focusing mode.

Figure 3:
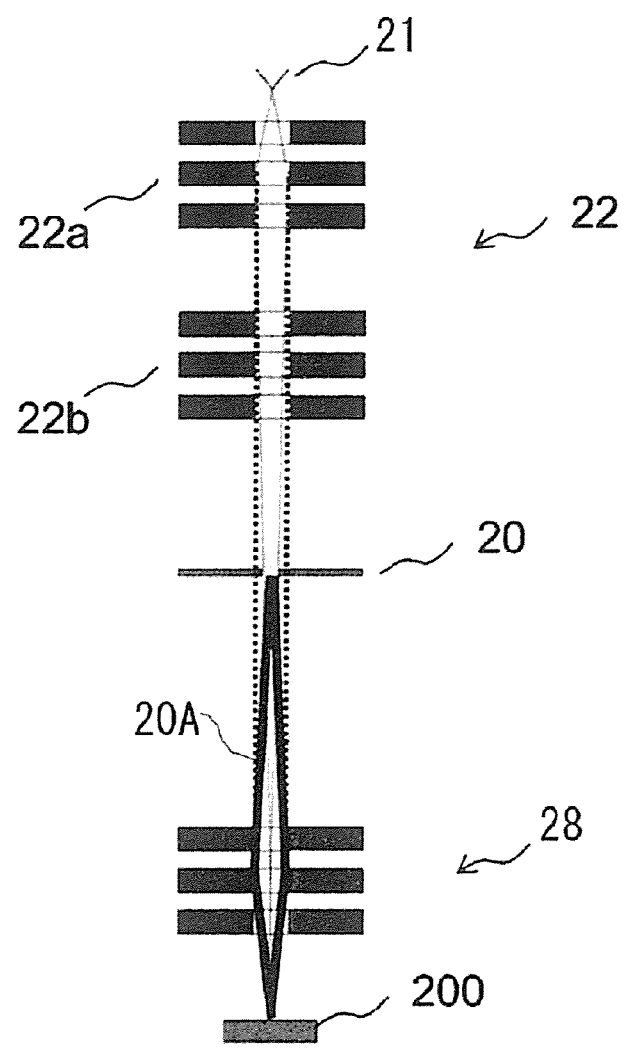
FIG. 3 is a diagram showing a configuration of a condenser lens, an aperture, and a projection lens in an FIB column.

FIG. 3 is a diagram showing the condenser lens 22, the aperture 24, and the projection (objective) lens 28 in the FIB column 20.

The condenser lens 22 is composed of two lenses 22a and 22b. Because of this, it is possible to adjust the probe current passing through the slit 24s of the aperture 24. An increase in the probe current causes an increase in an angular aperture of the beam passing through the aperture 24, so an aberration increases and a sharp beam profile may not be acquired. Therefore, the size of the optimum slit 24s is set depending on a desired beam profile.

In addition, in FIG. 3, the condenser lens is composed of two stages 22a and 22b, but without being limited thereto, the condenser lens may be one stage.

The condenser lens 22 and the projection lens 28 are electrostatic lenses.

In addition, when the transfer mode is employed, the projection magnification of the aperture 24 is determined on the basis of a relationship between distances between the aperture 24, the projection lens 28, and the sample 200.

In addition, in the transfer mode used in the present disclosure, the voltage of the condenser lens 22 is set such that the beam is focused on a main surface of the projection lens 28 by the condenser lens 22. The above-described aperture 24 is provided between the condenser lens 22 and the projection lens 28, and the voltage of the projection lens 28 is determined such that the opening shape of the slit 24s of the aperture 24 is transferred onto the sample 200.

Because of this, like the trajectory (shown in a bold solid line) from the aperture 20 to the sample 200 in FIG. 3, an opening-shaped beam is emitted to the sample, so that the aperture shape is transferred onto the sample.

Herein, in the transfer mode, in order to project the opening shape of the aperture 24 onto the sample 200, it is necessary to use the slit 24s of the aperture 24 as a light source and form an image of the light source on the sample 200 by the projection lens 28. Therefore, an applied voltage of the projection lens 28 is uniquely determined geometrically.

Hereinafter, characteristics of the present disclosure will be described with reference to FIGS. 4 to 11.

Herein, as the degree to reduce the absolute value of the voltage applied to the condenser lens 22 scaled to be 100, by Köhler illumination, with a voltage applied to the condenser lens 22 when the focused ion beam 20A is focused on the main surface of the projection lens 28, the applied voltage of the condenser lens 22 is set to be less than 100 and greater than or equal to 80. In addition, the aperture 24 corresponds to a field stop in Köhler illumination.

Figure 4:
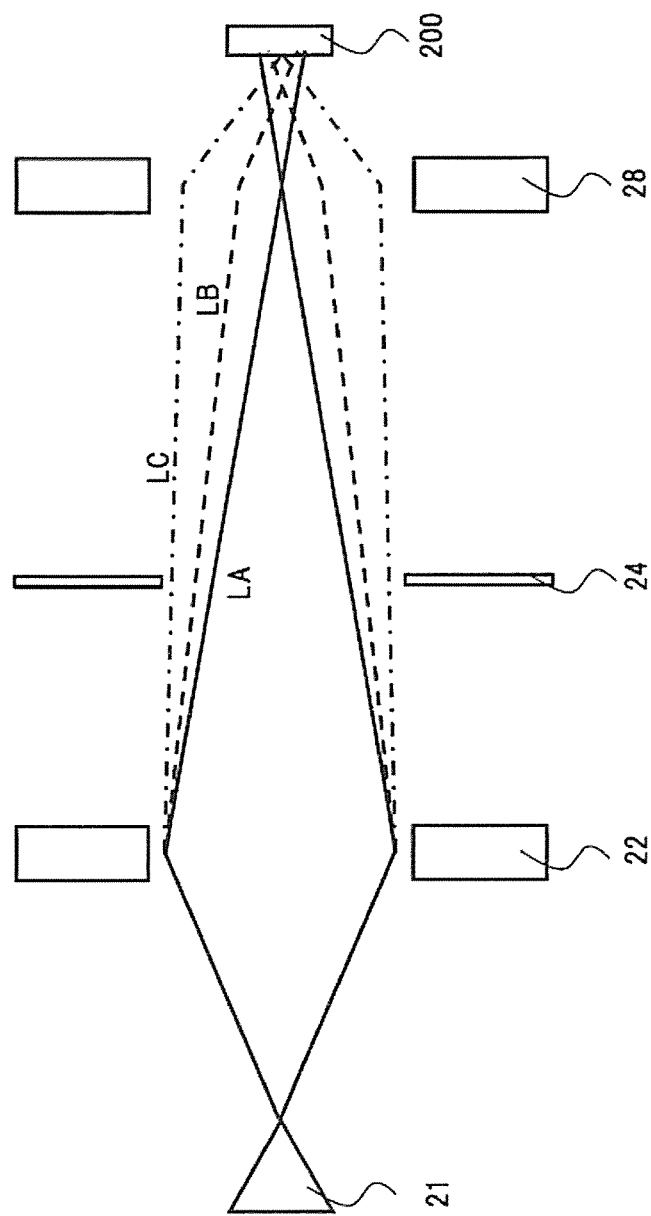
FIG. 4 is a diagram showing a relationship between an applied voltage of a condenser lens 22 and a trajectory of a focused ion beam.

In addition, in FIG. 4, under the above conditions according to Köhler illumination, with respect to trajectory LA of the ion beam when the applied voltage of the condenser lens 22 is 100, trajectories LB and LC of the ion bean when the respective applied voltages are 89 and 85 are more concentrated at the center of the sample 200 than trajectory LA.

Figure 5:
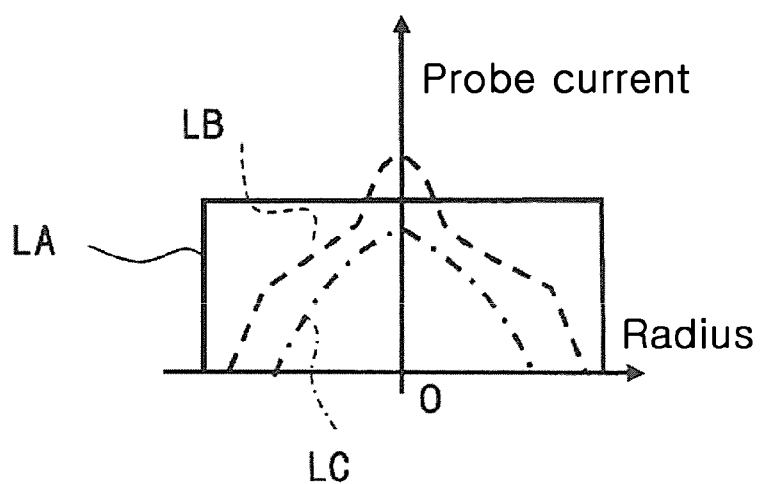
FIG. 5 is a diagram showing a distribution of probe current in the plane direction of a sample for each trajectory of FIG. 4.

In addition, in FIG. 5, the probe current for trajectory LA goes from the center O of the surface of the sample 200 in the radius direction (outward surface direction), and is uniform (rectangle).

In the meantime, the probe current for trajectories LB and LC is strongest at the center O of the surface of the sample 200 and decreases in the radius direction (outward surface direction).

From the above, the applied voltage of the condenser lens 22 is set to be less than 100 and to be equal to or greater than 80.

As described above, the probe current is concentrated near the center of the sample 200 by making the absolute value of the voltage applied to the condenser lens 22 low, so that operation efficiency when the cross-section sample is produced is improved.

Figure 6:
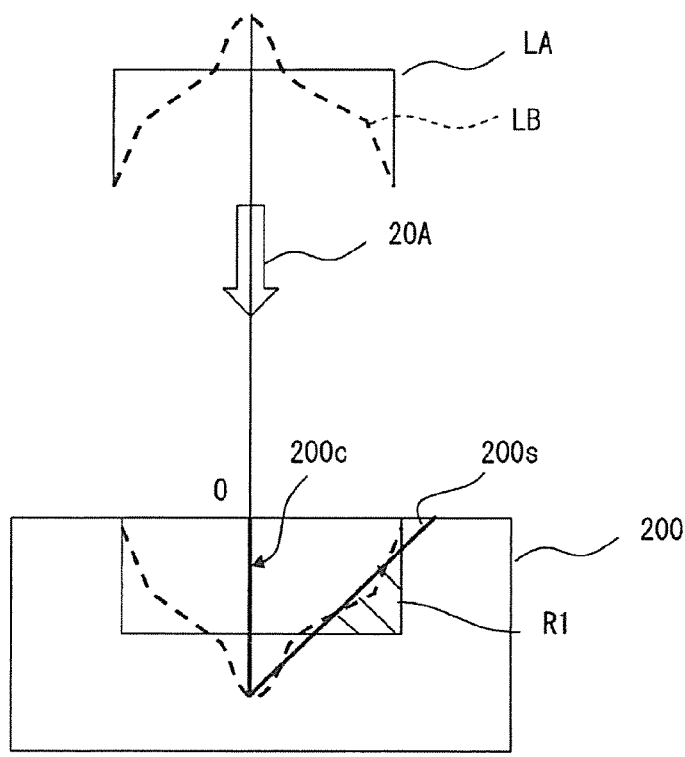
FIG. 6 is a diagram showing an etching depth of a sample by each probe current of FIG. 4.

That is, as shown in FIG. 6, the probe current for trajectory LA when the applied voltage of the condenser lens 22 is 100 is uniform (rectangular). Therefore, when the sample 200 is etched with the probe current for trajectory LA, the sample is etched at the uniform depth of inversion of the rectangular shape.

Figure 12:
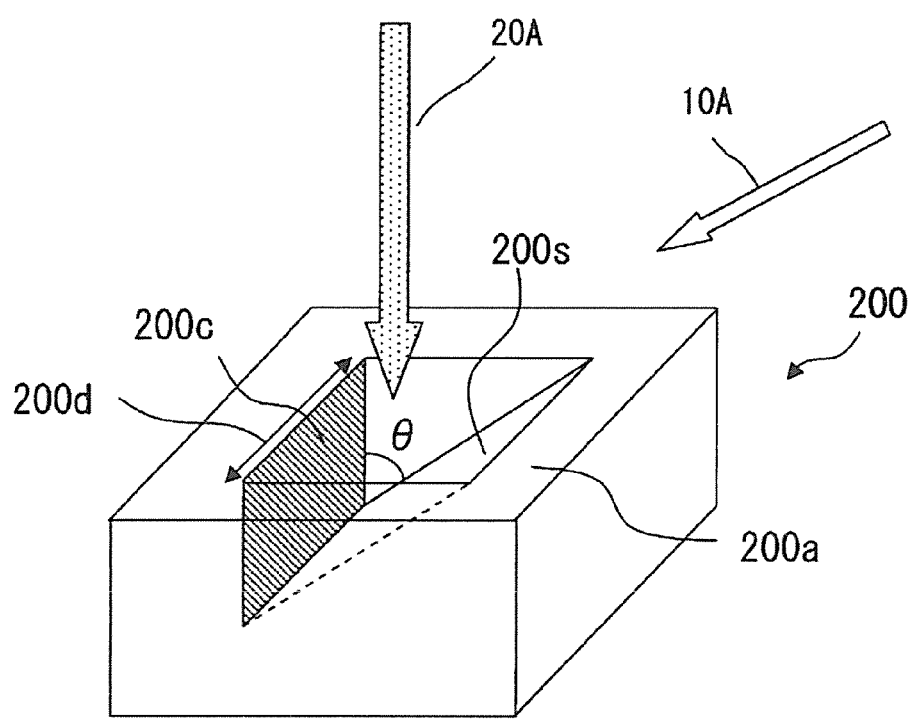
FIG. 12 is a diagram showing a shape of a sample subjected to cross-section processing by a focused ion beam.
Figure 13:
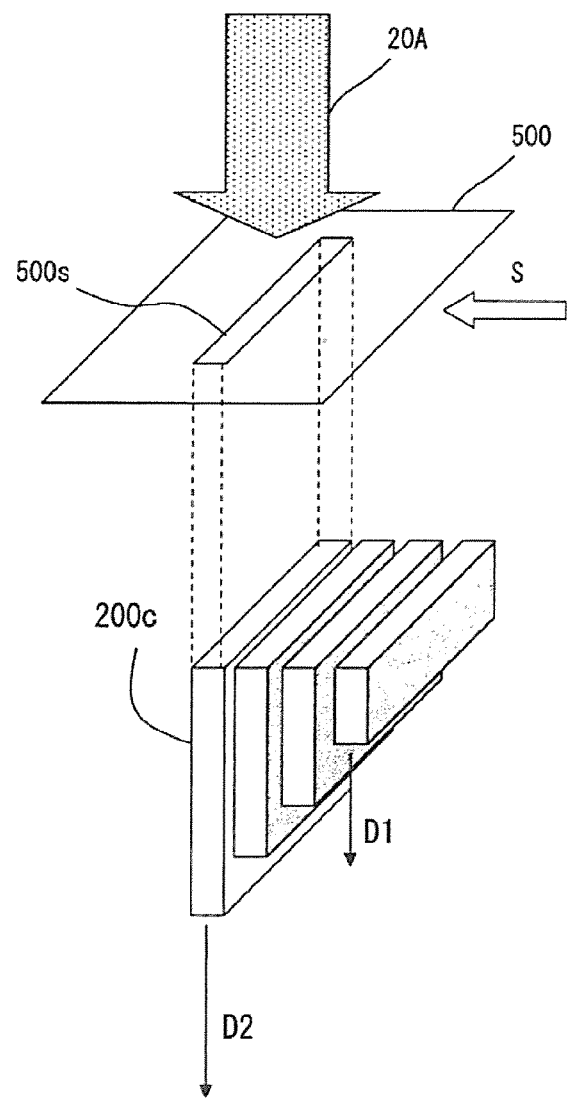
FIG. 13 is a diagram showing a conventional method of performing cross-section processing on a sample of FIG. 12 by using an aperture.

However, as shown in FIG. 12, a required cross-section sample has a shape in which a cross-section 200c is etched vertically from the sample surface and a slope 200s is connected to the cross-section 200c. When etching at a uniform depth is performed, etching is deeper than the slope 200s as shown as hatching R1 in FIG. 6, so that etching of part R1 is useless and operation efficiency decreases. In the meantime, when etching at a uniform depth is performed, etching is insufficient in the cross-section 200c and the time taken for additional etching is required, resulting in a decrease in operation efficiency.

Therefore, when the sample 200 is etched with the probe current having a current density distribution where the peak is at the center O for trajectory LB and a gradual decrease is shown as it goes away from the center, the center O with high current density is etched most deeply.

As a result, the sample 200 is etched into the cross-section 200c and an approximately V-shaped contour connected to the cross-section 200c, so that the ion beam is used for etching without waste. In addition, when the peak of the probe current is matched to the cross-section 200c where deepest etching is required, the cross-section 200c is deeply etched without additional etching.

Consequently, operation efficiency is improved.

In addition, sputter products generated due to etching adhere to the cross-section that is an observation target, and etching of an unnecessary region is reduced, so that adhesion of sputter products to the cross-section is reduced and operation efficiency is improved.

In addition, as shown in FIG. 7, in the present disclosure, the aperture 24 having the slit 24s of which at least one side 24t is in a straight line shape (in FIG. 6, a rectangular shape, overall) is used. In addition, as shown in FIG. 8, the side of the aperture 24 is approximately aligned with the center O of the focused ion beam 20A.

Figure 8:
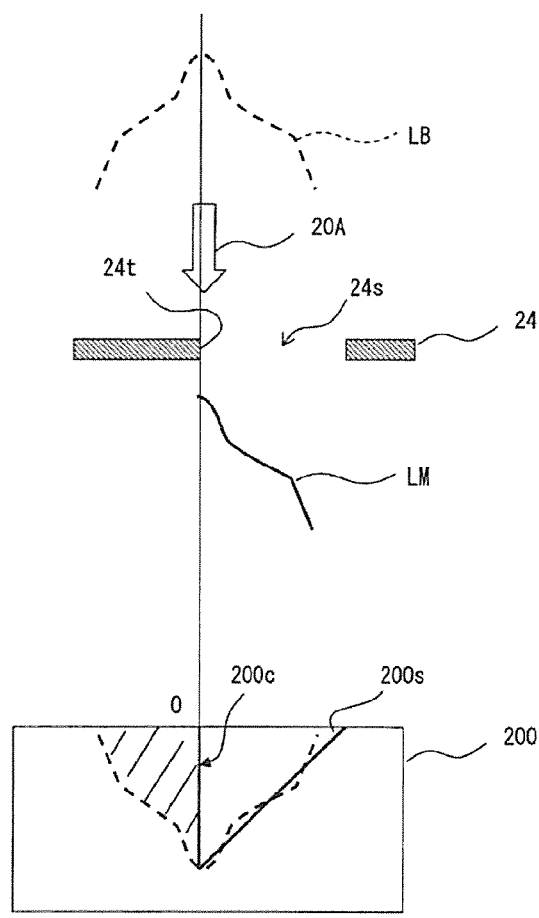
FIG. 8 is a diagram showing a probe current when one side of an aperture is aligned with the center of a focused ion beam, and a resulting etching depth of a sample.

That is, in FIG. 8, since the probe current for trajectory LB of the ion beam has the distribution where the current density is high at the center O and a gradual decrease is shown as it goes away from the center, when the sample 200 is etched with the probe current for trajectory LB, etching is performed in a shape of inversion of the current density distribution, where the center O is the deepest.

However, as shown in FIG. 12, a required sample cross-section has a shape in which the cross-section 200c is etched vertically from the sample surface and a slope 200s is connected to the cross-section 200c. Therefore, when the side 24t of the aperture 24 is aligned with the center O of the focused ion beam 20A, in the probe current distribution for trajectory LB, a half (the left side of FIG. 8) from the center O is masked and only the opposite half from the center O operates as probe current LM.

As a result, the sample 200 is etched into the cross-section 200c and an approximate V shape connected to the cross-section 200c, and this is close to the contour of the cross-section 200c and the slope 200s, so that the ion beam is used for etching without waste.

In addition, the probe current passing through the aperture 24 performs etching into a shape close to the contour of the cross-section 200c and the slope 200s, so that without scanning with the focused ion beam, the shape of the cross-section of the sample 200 is formed at once using the aperture 24, whereby operation efficiency is further improved.

In addition, since the ion beam is masked by one side 24t, which is in a straight line shape, of the slit 24s of the aperture 24 so as to etch the cross-section 200c, a rounded edge (step) rarely occurs at the cross-section, thereby improving the shape of the cross-section.

Figure 9:
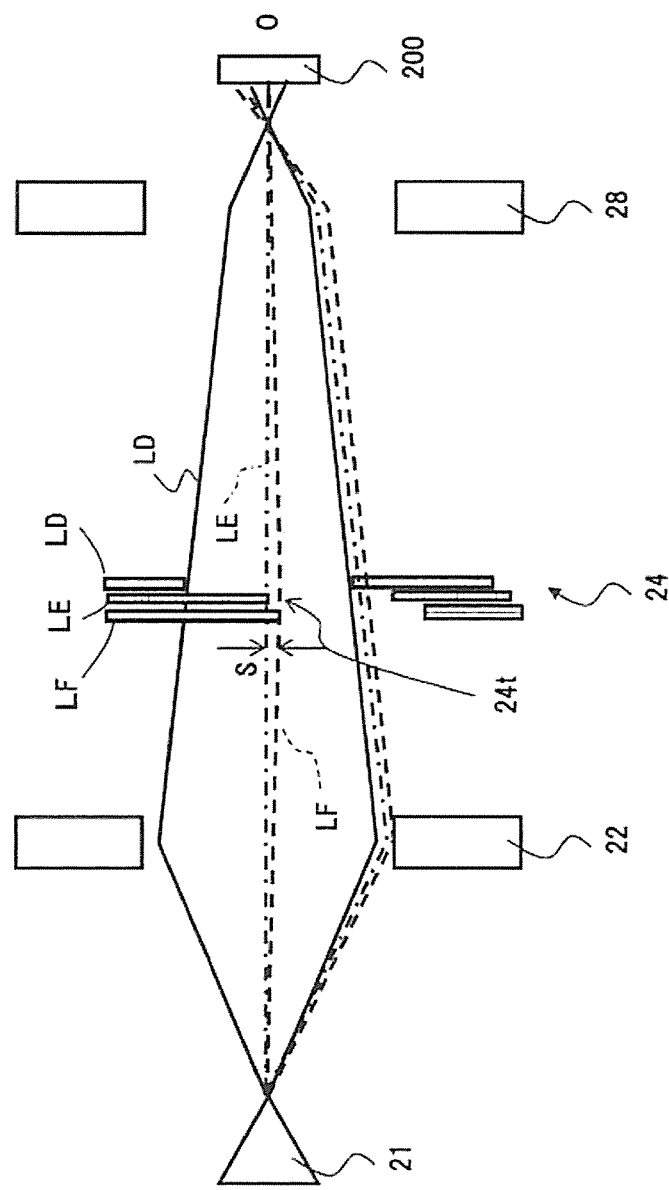
FIG. 9 is a diagram showing trajectories of a focused ion beam according to changes in positions of one side of an aperture.

FIG. 9 shows trajectories LD to LF of the focused ion beam 20A according to changes in positions of one side 24t of the aperture 24.

A trajectory where the center of the slit 24s of the aperture is aligned with the center O of the focused ion beam 20A is set as LD, and a trajectory with one side 24t of the aperture 24 aligned with the center O of the focused ion beam 20A is set as LE. In addition, a trajectory with the one side 24t of the aperture 24 set more inside than the center O of the focused ion beam 20A (that is, the center O of the focused ion beam 20A is located at a position masked by the aperture 24 further from the one side 24t).

Herein, with LF, the width (distance) by which the center O of the focused ion beam 20A is masked by the aperture further from the one side 24t is S.

Figure 10:
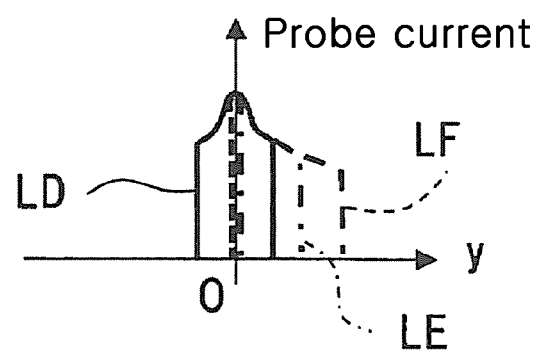
FIG. 10 is a diagram showing a distribution of probe current in a plane direction of a sample for each trajectory of FIG. 9.

As shown in FIG. 10, in trajectory LD where the one side 24t of the aperture 24 is away from the center O of the focused ion beam 20A, the probe current has the highest peak at the center O.

However, in trajectories LE and LF where the one side of the aperture 24 is approximately aligned with the center O of the focused ion beam 20A, the probe current has a shape of only the right half from the center O as shown in FIG. 8 and increases in the outward radius direction at the right half from the center O than that for trajectory LD.

Accordingly, since the one side 24t of the aperture 24 is approximately aligned with the center O of the focused ion beam 20A, a rounded edge (step) rarely occurs at the cross-section. Thus, the shape of the cross-section is improved, and the ion beam is used for etching without waste because the probe current has a shape close to the contour of the slope 200s.

Figure 11:
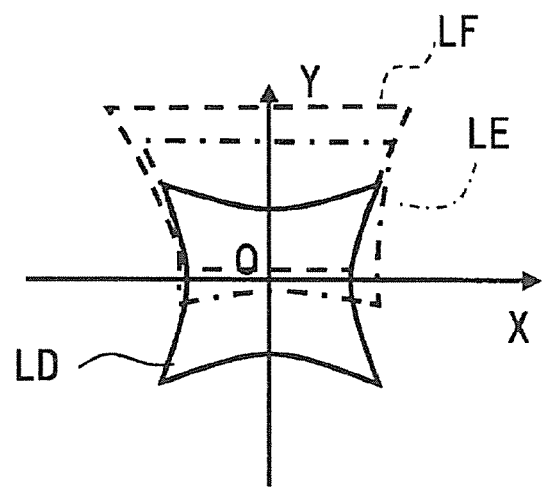
FIG. 11 is a diagram showing a plane contour in a final shape after etching of a cross-section of a sample, for each trajectory of FIG. 9.

FIG. 11 shows, for each of trajectories LD to LF, a plane contour (a plane shape of an etched concave portion of the sample 200 when viewed from the irradiation direction of the focused ion beam) in a final shape after etching of the cross-section of the sample 200.

According to ideal optics, in trajectory LE where the one side 24t of the aperture 24 is aligned with the center O of the focused ion beam 20A, a straight beam profile is acquired at the irradiation portion of the cross-section 200c along the one side 24t. However, usually, an ideal condition is not provided. As shown in FIG. 11, trajectory LF where the center O of the focused ion beam 20A is set to be masked by the aperture 24 further from the one side 24t tends to acquire a straight beam profile at the irradiation portion (a straight portion in the X direction of broken line LF in FIG. 11) of the cross-section 200c along the one side 24t.

Therefore, the position of the aperture 24 is set such that the center O of the focused ion beam 20A is masked by the aperture 24 at a distance of 500 μm or less, further from the one side 24t (that is, distance S of FIG. 9<500 μm).

Herein, as shown in FIG. 12, it is preferable that the length of an intersection line (ridge) 200d between the surface 200a and the cross-section 200c of the sample 200 is equal to or greater than 10 μm and equal to or less than 1 mm. In order to create the length of the ridge 200d, the length of the one side 24t of the aperture 24 varies depending on the projection magnification of the aperture 24, but is usually equal to or greater than 1 μm, specifically, 1 mm.

The present disclosure is not limited to the above embodiment, and various modifications and equivalents are included in the idea and the scope of the present disclosure.

The focused ion beam processing apparatus of the present disclosure needs to include at least the focused ion beam column, and the electron beam column is not an essential element.

In the focused ion beam processing apparatus of the present disclosure, the beam size of the focused ion beam is adjustable by adjusting applied voltage of the projection lens.

In the transfer mode, the shape of the focused ion beam reflects the shape of the slit, and the projection magnification for transferring the shape of the slit is uniquely determined by the geometry of the aperture, the projection lens, and the sample. Therefore, the shape of the aperture needs to be changed to change the length of the cross-section through cross-section processing of the sample. However, for example, if a cross-section larger e.g., 10% larger) than the current slit is intended to be created, another aperture having a larger slit needs to be used or an additional slit needs to be formed in one aperture, which causes problems with operation efficiency or a device space.

Therefore, when the applied voltage of the projection lens is changed, the projection magnification is thus changed, thereby easily changing the length of the cross-section.

In addition, the beam is distorted when the applied voltage of the projection lens is changed, so it is difficult to accurately transfer the shape of the slit. However, in forming a cross-section, there is no problem as long as the edge of the beam is straight.

In addition, when the ion source is a plasma ion source, a high current ion beam is acquired compared to a Ga ion source, and the like, so that operation efficiency is improved.

What is claimed is:

1. A focused ion beam processing apparatus for processing a cross-section parallel to an irradiation direction of a focused ion beam with respect to a sample comprising:
    an ion source;
    a sample stage holding a sample;
    a condenser lens focusing ions emitted from the ion source into a focused ion beam;
    an aperture having a slit with at least one side in a straight line shape, the slit being used to mask a part of the focused ion beam focused by the condenser lens to process the sample into a desired shape;
    a projection lens placed in a beam path between the aperture and the sample stage, and focusing the focused ion beam that passed through the aperture on a predetermined position on the sample; and
    a computer as a control means configured to control elements of the focused ion beam processing apparatus,
    wherein, in a transfer mode, the computer is configured to set:
        an applied voltage of the condenser lens to be 80% or more and less than 100% relative to an initial applied voltage of the condenser lens, wherein the initial applied voltage is set when the focused ion beam is focused on a main surface of the projection lens by Köhler illumination;
        a position of the aperture such that the focused ion beam is masked by the aperture with the at least one side of the aperture at a distance greater than 0 μm and equal to or less than 500 μm from a center of the focused ion beam; and
        an applied voltage of the projection lens such that an image formed by the slit of the aperture is focused on a surface of the sample, and
    wherein the surface of the sample is irradiated at once with the focused ion beam that is formed in a shape of the slit without scanning with the focused ion beam so that the shape of the slit is transferred onto the sample in the transfer mode.

2. The focused ion beam processing apparatus of claim 1, wherein a beam size of the focused ion beam is adjustable by adjusting applied voltage of the projection lens.

3. The focused ion beam processing apparatus of claim 1, wherein the slit of the aperture is in a rectangular shape.

4. The focused ion beam processing apparatus of claim 2, wherein the slit of the aperture is in a rectangular shape.

5. The focused ion beam processing apparatus of claim 1, wherein the ion source is a plasma ion source.

6. The focused ion beam processing apparatus of claim 2, wherein the ion source is a plasma ion source.

7. The focused ion beam processing apparatus of claim 3, wherein the ion source is a plasma ion source.

8. The focused ion beam processing apparatus of claim 4, wherein the ion source is a plasma ion source.

* * * * *